(12) United States Patent
Jeong et al.

(10) Patent No.: US 7,402,944 B2
(45) Date of Patent: Jul. 22, 2008

(54) ORGANIC LIGHT EMITTING DISPLAY DEVICE AND METHOD OF FABRICATING THE SAME

(75) Inventors: Chang-Yong Jeong, Suwon-si (KR); Tae-Wook Kang, Seongnam-si (KR); Chang-Soo Kim, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 523 days.

(21) Appl. No.: 11/131,963

(22) Filed: May 18, 2005

(65) Prior Publication Data

US 2005/0269946 A1    Dec. 8, 2005

(30) Foreign Application Priority Data

Jun. 3, 2004   (KR) .................... 10-2004-0040541

(51) Int. Cl.
*H01L 51/52* (2006.01)
*H01L 51/50* (2006.01)
*H01L 51/56* (2006.01)

(52) U.S. Cl. .................. 313/503; 313/500; 313/505; 313/506; 313/504; 257/40; 257/79; 257/E51.022; 257/E51.018; 257/E51.019; 438/99; 438/637; 438/652

(58) Field of Classification Search ......... 313/498–512; 257/40, 79, 98, E51.022, E51.018, E51.019; 445/24, 25; 438/34, 35, 99, 637–640, 652, 438/666–669

See application file for complete search history.

(56) References Cited

U.S. PATENT DOCUMENTS

| | | | | | |
|---|---|---|---|---|---|
| 5,485,055 | A | * | 1/1996 | Keyser | 313/505 |
| 5,684,365 | A | * | 11/1997 | Tang et al. | 313/500 |
| 6,383,831 | B2 | * | 5/2002 | Kim | 438/34 |
| 6,544,809 | B2 | * | 4/2003 | Lim | 313/504 |
| 7,312,571 | B2 | * | 12/2007 | Kim | 313/506 |

* cited by examiner

*Primary Examiner*—Mariceli Santiago
(74) *Attorney, Agent, or Firm*—Christie, Parker & Hale, LLP

(57) ABSTRACT

An organic light emitting display device (OLED) and a method of fabricating the same, in which electric field influence between first and second electrodes is reduced in an edge region of a unit pixel. The OLED includes a substrate, and a thin film transistor (TFT) located on the substrate. A passivation layer is located on the TFT over substantially an entire surface of the substrate, and has a via hole for exposing source or drain electrode, and a groove. A first electrode on the passivation layer is in electrical contact with the exposed source or drain electrode through the via hole, and has an edge located in the groove. A pixel defining layer is located on the first electrode and has an opening for exposing a predetermined portion of the first electrode. An organic layer is in contact with the predetermined portion, and a second electrode is formed on the organic layer.

23 Claims, 6 Drawing Sheets

US 7,402,944 B2

ORGANIC LIGHT EMITTING DISPLAY DEVICE AND METHOD OF FABRICATING THE SAME

CROSS-REFERENCE TO RELATED APPLICATION

This application claims priority to and the benefit of Korean Patent Application No. 10-2004-0040541, filed Jun. 3, 2004, the disclosure of which is incorporated herein by reference in its entirety.

BACKGROUND OF THE INVENTION

1. Field of the Invention

The present invention relates to an organic light emitting display device and a method of fabricating the same and, more particularly, to an organic light emitting display device and a method of fabricating the same, which is capable of improving the degradation of unit pixel edges caused by an electric field between an anode and a cathode by increasing a gap between the anode and the cathode.

2. Description of the Related Art

As a highly advanced information-oriented society has arrived, a consumer's demand for obtaining information rapidly and correctly in hand is increasing. In order to meet this demand, the development of various display devices which are thin and light to be easily carried and has a high information processing rate, has been accelerated. A conventional cathode ray tube (CRT) has problems of heavy weight, large volume and high power consumption, and a liquid crystal display device (LCD) has problems of complex processes, narrow viewing angles, and technical limitations on contrast ratio and a large-screen display. An organic light emitting display device (hereinafter, referred to as "OLED") capable of solving the problems is rapidly rising as the next generation display device.

Since the OLED is an emissive display device in which, when voltage is applied to an organic layer including an organic emission layer, electrons and holes are recombined in the emission layer to emit light, the OLED does not require a backlight unit unlike the LCD. As a result, the OLED has advantages of light weight and small thickness, simple processes, response speed nearly equal to the CRT, and low power consumption.

In general, the OLED is classified into a passive matrix type and an active matrix type depending on driving methods. The passive matrix OLED has advantages of simpler manufacturing processes since its display region is configured of simple matrix elements made of anodes and cathodes, however, its application is limited to low-resolution and small-sized displays due to problems of low resolution, high driving voltage, and lifetime reduction of the material. On the contrary, the active matrix OLED is advantageous to apply to high-resolution and large-sized displays since its display region includes thin film transistors in every pixel and uniform current is supplied to the respective pixels regardless of the number of the pixels of the OLED to thereby have stable brightness characteristics and reduced power consumption. For these reasons, the active matrix OLED is at the center of attention amongst the next generation display devices by virtue of its excellent performance and market potential.

This OLED is made of an organic layer including at least an emission layer between an anode and a cathode. The OLED may realize a full color display by depositing the emission layer with materials for representing three primary colors of red, green and blue, and then patterning them.

FIG. 1 is a plan view of a conventional OLED. A method of fabricating the conventional OLED will be described with reference to FIG. 1.

FIG. 1 is a plan view of the conventional OLED, one pixel of which includes red (R), green (G) and blue (B) unit pixels.

Referring to FIG. 1, a scan line 10 arranged in one direction, data lines 20 insulated from and crossing the scan line 10, and common power source-supply lines 30 insulated from and crossing the scan line 10, and arranged parallel to the data lines 20 are disposed in the pixel. A plurality of unit pixels, for example, the red (R), green (G) and blue (B) unit pixels are defined by the scan line 10, the data lines 20 and the common power source-supply lines 30.

Each unit pixel includes a switching thin film transistor (TFT) 40 for performing ON/OFF operation according to control of a signal applied through the scan line 10, a capacitor 60 for storing a data voltage applied to the switching TFT, a driving TFT 50 for supplying a current corresponding to the data voltage stored in the capacitor 60, and an organic light emitting diode 80 for performing emission operation in response to the current supplied from the driving TFT 50. The organic light emitting diode 80 includes a first electrode 70. The organic light emitting diode 80 is supplied through the driving TFT 50 with a driving current corresponding to the data voltage stored in the capacitor 60, and performs the emission operation corresponding to the supplied current.

FIG. 2 is a cross-sectional view taken along the line I-I' in FIG. 1, which shows one unit pixel of the OLED.

A method of fabricating the OLED will be described with reference to FIG. 2 as follows. First, a buffer layer 110 may be formed on an insulating substrate 100. The TFT, which includes a semiconductor layer 125, a gate insulating layer 120, a gate electrode 135, an interlayer insulating layer 130 and source and drain electrodes 145, is then formed on the buffer layer 110 using a conventional method.

A passivation layer 140 is formed on substantially the entire surface of the interlayer insulating layer 130, a planarization layer 150 is formed on the passivation layer 140, and then a via hole 165 exposing a predetermined portion of one electrode of the source and drain electrodes 145 is formed.

A first electrode 160 being in contact with the exposed predetermined portion of one of the source and drain electrodes 145 through the via hole 165 is formed.

After forming a pixel-defining layer 170 that covers the first electrode 160 having an indented shape due to the via hole 165, an opening 195 for exposing a portion of the first electrode 160 is formed on the pixel-defining layer 170.

Further, after forming an organic layer 180 including at least an emission layer in the opening 195 and in contact with the first electrode 160 exposed in the opening 195, a second electrode 190 is formed on substantially the entire surface of the substrate including the organic layer 180 in the opening 195.

Since electric charges may readily be concentrated on an edge 161 of the first electrode, the influence of the electric field between the edge 161 of the first electrode and the second electrode may be maximized to apply excessive voltage to the organic layer, thereby accelerating deterioration of the organic layer. As a result, lifetime of the fabricated OLED may be reduced.

SUMMARY OF THE INVENTION

The present invention, therefore, solves aforementioned problems associated with conventional devices by providing an OLED and a method of fabricating the same which is capable of increasing lifetime through reduction or minimization of degradation of an organic layer by increasing a gap between an edge of a first electrode and a second electrode to reduce an electric field between the edge of the first electrode and the second electrode.

In exemplary embodiments of the present invention, an OLED and a method of fabricating the same, in which field influence between first and second electrodes is reduced in an edge region of a unit pixel, are provided.

In an exemplary embodiment according to the present invention, an organic light emitting display device (OLED) includes a substrate; a thin film transistor (TFT) located on the substrate, and having a semiconductor layer, a gate electrode, and source and drain electrodes on the substrate; and a passivation layer located on the TFT and over substantially an entire surface of the substrate, and having a via hole for exposing one electrode of the source and drain electrodes, and a groove. The OLED also includes a first electrode on the passivation layer, the first electrode being in electrical contact with the one electrode of the source and drain electrodes through the via hole, and having an edge located in the groove; and a pixel defining layer located on the first electrode and having an opening for exposing a predetermined portion of the first electrode. The OLED also includes an organic layer having at least one emission layer, a predetermined region of which is in contact with the predetermined portion of the first electrode; and a second electrode formed on the organic layer.

In another exemplary embodiment according to the present invention, a method of fabricating an OLED includes: forming a TFT having a semiconductor layer, a gate electrode, source and drain regions, and source and drain electrodes, on a substrate; forming a passivation layer on substantially an entire surface of the substrate having the TFT; forming a via hole for exposing one electrode of the source and drain electrodes and a groove formed by etching a portion of the passivation layer, on the passivation layer; forming a first electrode on the passivation layer, the first electrode being in electrical contact with one electrode of the source and drain electrodes through the via hole, and having an edge located in the groove; forming a pixel defining layer on substantially an entire surface of the substrate, the pixel defining layer having an opening for exposing a predetermined portion of the first electrode; forming an organic layer having at least an emission layer in the exposed opening of the pixel defining layer; and forming a second electrode on the organic layer.

The passivation layer may be made of a silicon oxide layer, a silicon nitride layer, a stacked layer of the silicon oxide layer and the silicon nitride layer, or the like. While the via hole for connecting one of the source and drain electrodes to the first electrode is formed on the passivation layer, the groove may be concurrently formed on a portion of the passivation layer to form an edge of the first electrode in the groove to thereby increase a gap between the edge of the first electrode and the second electrode, thereby reducing or minimizing influence of edge field due to reduction of electric field.

In addition, the OLED may further include a planarization layer for planarizing a step formed by the TFT on the passivation layer.

The planarization layer may be formed of one material selected from polyimid resin, polyamide resin, polyacryl resin, polyphenol resin, silicon-based resin or benzocyclobuthene.

In this process, while forming the via hole for connecting one of the source and drain electrodes to the first electrode on the planarization layer and the passivation layer, the groove may be concurrently formed on the planarization layer and the passivation layer to form the edge of the first electrode in the groove.

As a result, the gap between the edge of the first electrode and the second electrode may be increased to reduce the electric field, thereby reducing or minimizing influence of edge field.

BRIEF DESCRIPTION OF THE DRAWINGS

The above and other features of the present invention will be described in reference to certain exemplary embodiments thereof with reference to the attached drawings in which.

DETAILED DESCRIPTION

Hereinafter, an OLED and a method of fabricating the same in accordance with exemplary embodiments of the present invention will be described with reference to FIGS. 3 and 4A to 4C.

Figure 3:
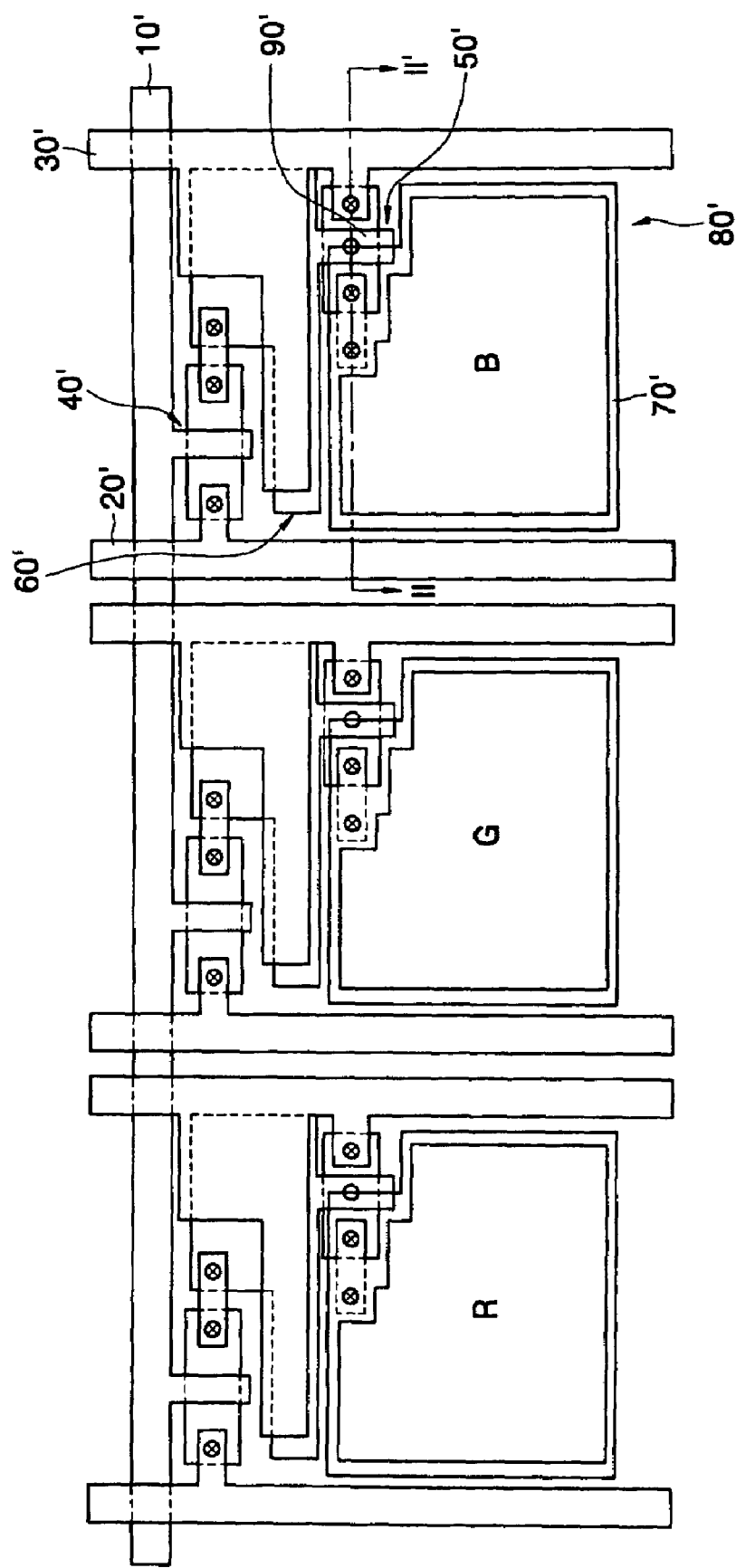
FIG. 3 is a plan view of an OLED for explaining a method of fabricating the same in accordance with an exemplary embodiment of the present invention.

FIG. 3 is a plan view of an OLED for explaining a method of fabricating the same in accordance with an exemplary embodiment of the present invention.

Figure 1:
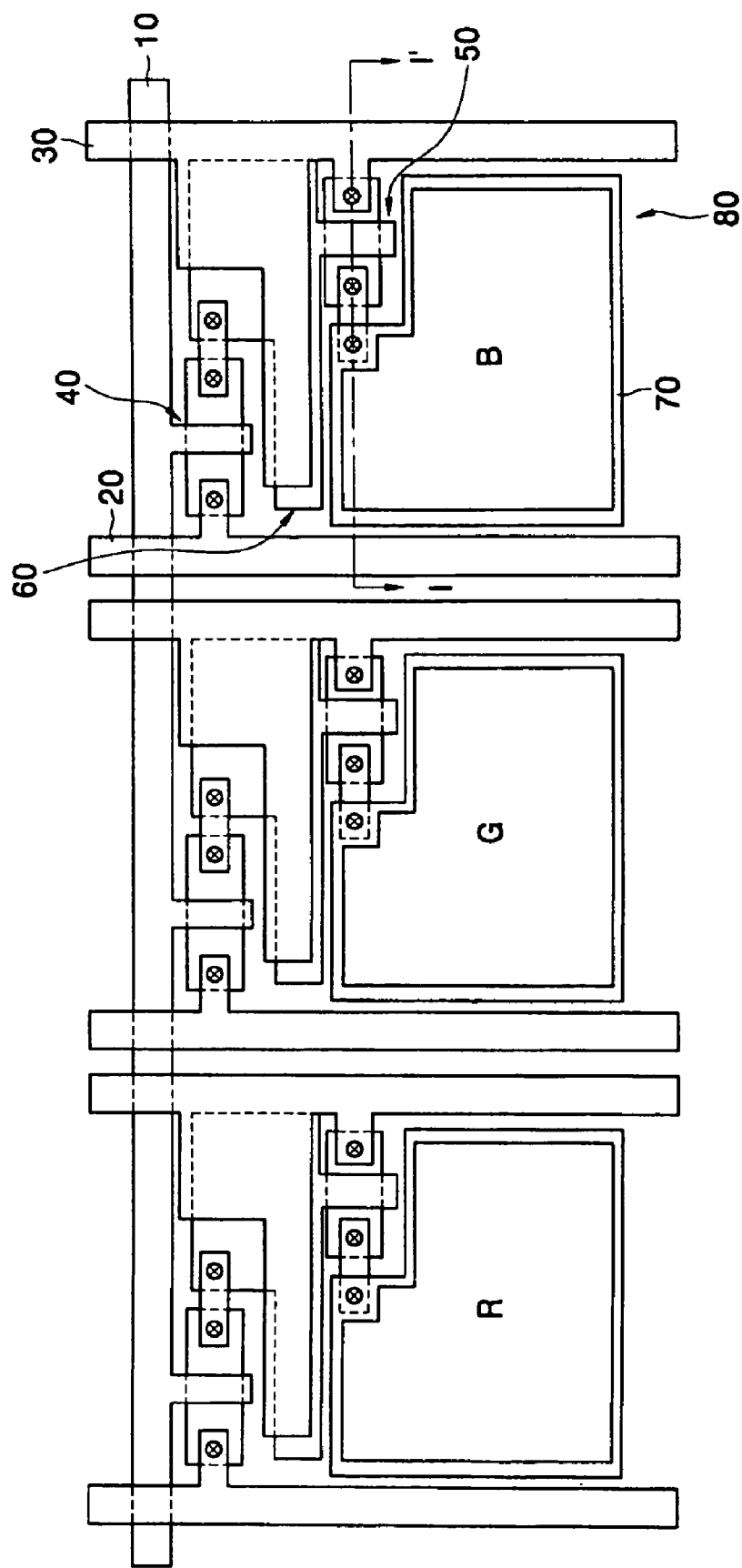
FIG. 1 is a plan view of a conventional OLED, one pixel of which includes red, green and blue unit pixels.
Figure 2:
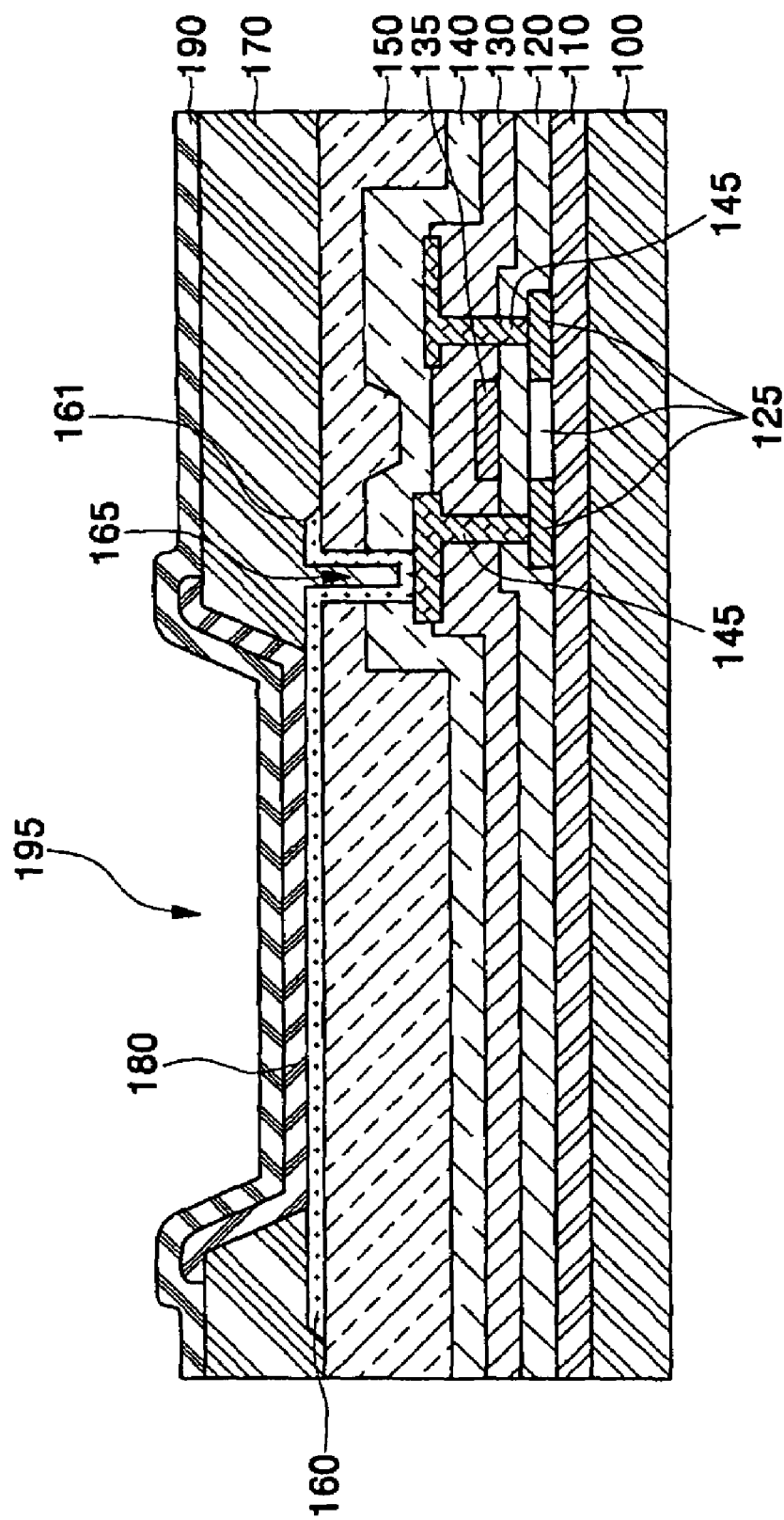
FIG. 2 is a cross-sectional view taken along the line I-I' in FIG. 1, which shows a unit pixel of the OLED.

Similar to the conventional OLED of FIG. 1, a pixel in the OLED of FIG. 3 includes a scan line 10', data lines 20' insulated from and crossing the scan line 10', and common power source-supply lines 30' insulated from and crossing the scan line 10'. The common power source-supply lines 30' are arranged parallel to the data lines 20'. The pixel includes R, G and B unit pixels, and each unit pixel includes a switching TFT 40', a driving TFT 50', a capacitor 60', an organic light emitting diode 80' having a first electrode 70', in much the same way as in the conventional OLED of FIG. 1. However, as shown in FIG. 3, it may be appreciated that the first electrode 70' is formed to extend to an upper portion of a gate electrode 90'.

Figure 4A:
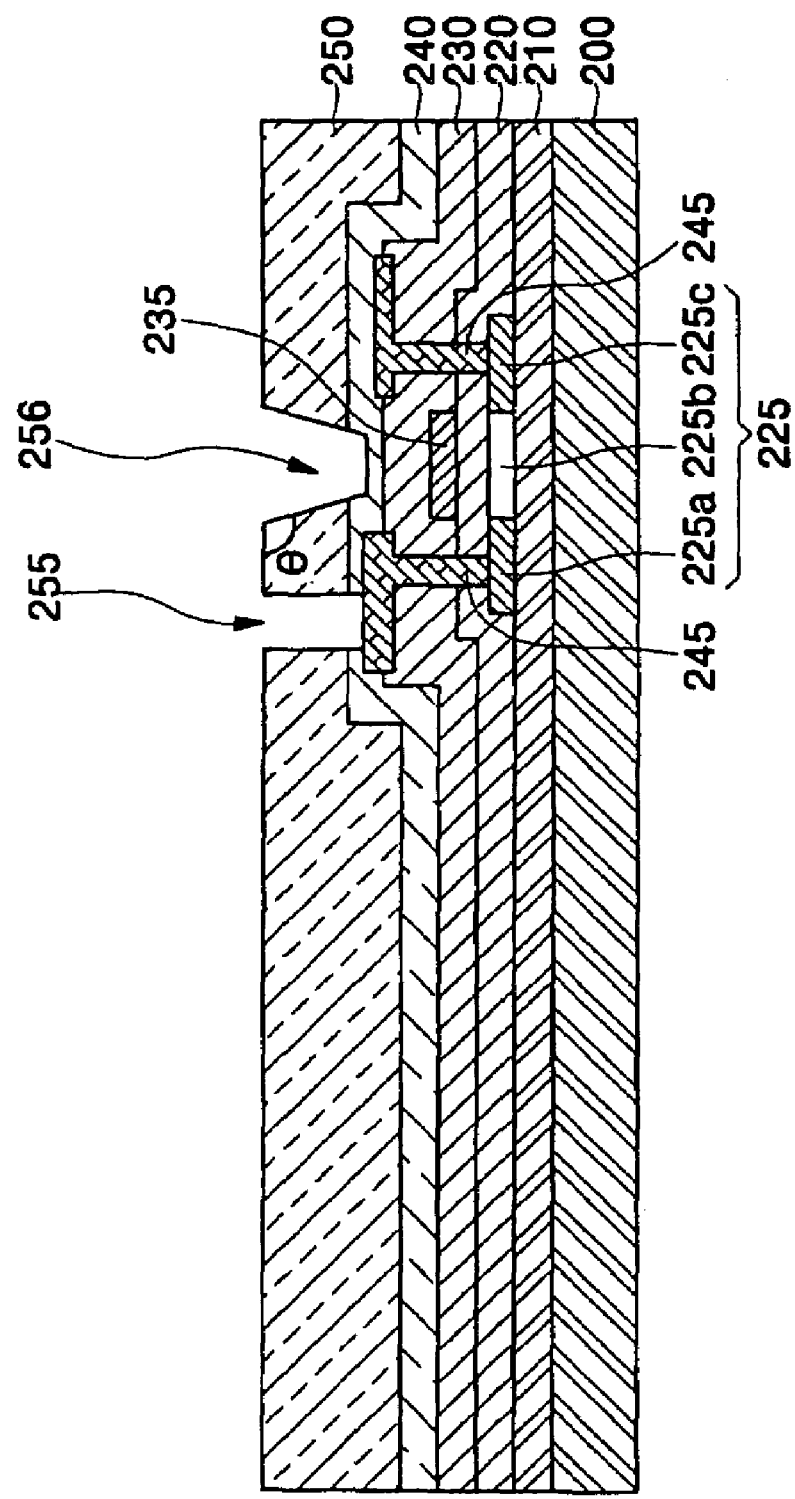
FIGS. 4A to 4C are cross-sectional views of an OLED for explaining a method of fabricating the same in accordance with an exemplary embodiment of the present invention, wherein the cross-sectional views are taken during various different stages of fabrication, along the line II-II' in FIG. 3.
Figure 4B:
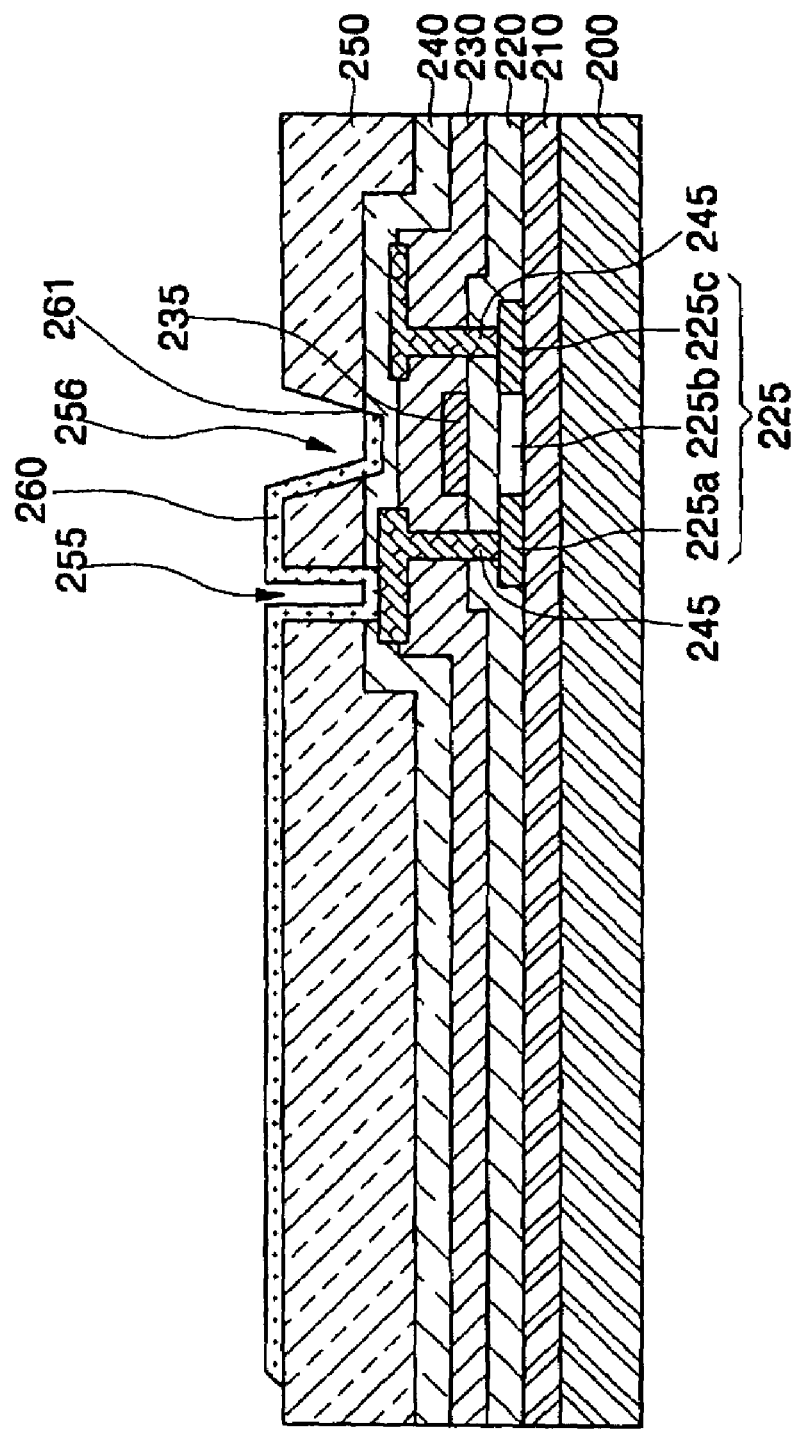
Figure 4C:
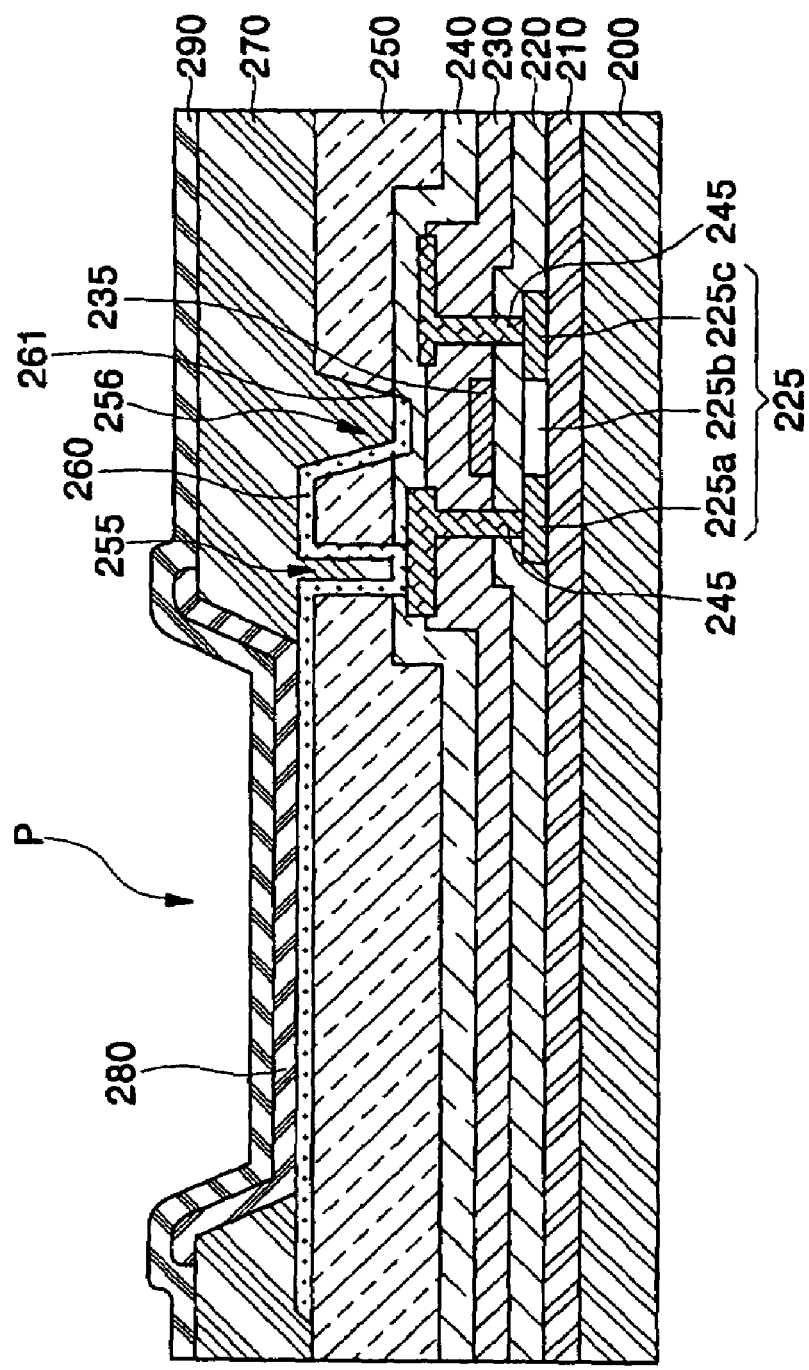

FIGS. 4A to 4C are cross-sectional views of an OLED for explaining a method of fabricating the same in accordance with an exemplary embodiment of the present invention, wherein the cross-sectional views are taken during various different stages of fabrication, along the line II-II' in FIG. 3.

Referring to FIG. 4A, a substrate 200 is provided, and in order to reduce or prevent diffusion of impurities from the substrate 200, the OLED includes a buffer layer 210 made, for example, of one selected from a silicon oxide layer, a silicon nitride layer, and a stacked layer of the silicon oxide layer and the silicon nitride layer.

After applying an amorphous silicon layer on the buffer layer 210 and crystallizing the amorphous silicon layer, a polysilicon layer 225 is formed by patterning the crystallized silicon layer.

After forming a gate insulating layer 220 on substantially the entire surface of the substrate including the polysilicon layer 225, a gate electrode 235 is deposited on a predetermined portion of the gate insulating layer 220, i.e., a portion corresponding to a position at which a channel region 225b is formed.

Then, the polysilicon layer 225 is ion doped to form a semiconductor layer 225 including a drain region 225a, a source region 225c and the channel region 225b.

An interlayer insulating layer 230 is formed on substantially the entire surface of the gate insulating layer 220, on which the gate electrode 235 was formed, and the gate insulating layer 220 and the interlayer insulating layer 230 are etched to form contact holes for exposing predetermined portions of the drain region 225a and the source region 225c.

Source and drain electrodes 245 are formed on the interlayer insulating layer 230 through contact holes to be connected to the source and drain regions 225c and 225a, respectively.

A passivation layer 240 for covering the source and drain electrodes 245 is formed on substantially the entire surface of the interlayer insulating layer 230. In this process, the passivation layer 240 should be made of one selected from a silicon oxide layer, a silicon nitride layer, and a stacked layer of the silicon oxide layer and the silicon nitride layer.

By way of example, the passivation layer should be formed to a thickness of approximately 1000 Å (0.1 µm)~1 µm.

A via hole 255 for exposing one of the source and drain electrodes 245 is formed on the passivation layer 240, and concurrently a groove 256 is formed on a portion of the passivation layer 240.

In this process, the via hole 255 and the groove 256 are patterned using a halftone mask, and then formed by a plasma etching process.

The plasma etching process should be performed under a process pressure of approximately 5~300 mTorr by applying a plasma power of 500 W or more.

The plasma etching process should be performed using a mixed gas in which $SF_6$ or $CF_4$ gas having an amount that is one percent (1%) or more of the amount of $O_2$ in terms of volume, is mixed with $O_2$ gas.

The groove 256 should be etched to a depth of approximately 500~6000 Å (0.05~0.6 µm).

In addition, since a gate interconnection, etc., may be formed between the edge of the first electrode and the source electrode, the edge of the first electrode and the source electrode should be formed to have a gap of approximately 500 Å (0.05 µm)~4 µm.

Further, a planarization layer 250 for planarizing a step by the TFT may be additionally formed on the passivation layer 240. In this case, the planarization layer 250 may substantially prevent the generation of diffused reflection due to the step formed by the TFT, as an organic layer is formed to have a small thickness in the following process.

In this case, the planarization layer 250 should be formed to a thickness of 5000 Å (0.5 µm)~2 µm.

By way of example, the planarization layer 250 may be formed of any suitable material, for example, one material selected from a group consisting of polyimid resin, polyamide resin, polyacryl resin, polyphenol resin, silicon-based resin and benzocyclobuthene. In forming the planarization layer on the passivation layer, both processes of forming the via hole 255 for connecting one electrode of the source and drain electrodes 245 to the first electrode and of forming the groove 256 should be concurrently performed.

In this process, the via hole 255 and the groove 256 are patterned using a halftone mask, and then formed by a plasma etching process.

The plasma etching process should be performed under a process pressure of approximately 5~300 mTorr by applying a plasma power of 500 W or more.

The plasma etching process should be performed using a mixed gas in which one gas selected from $SF_6$, $CF_4$ and $CHF_3$ gases is mixed with $O_2$ gas. In the mixed gas, the amount of the $O_2$ gas should be one percent (1%) or more of the amount of the selected gas in terms of volume.

After the planarization layer 250 is completely etched, in order to etch the groove of the passivation layer 240, the plasma etching process should be performed under a process pressure of approximately 5~300 mTorr by applying a plasma power of 500 W or more, and using a mixed gas in which $SF_6$ or $CF_4$ gas having an amount that is one percent (1%) or more of the amount of $O_2$ gas in terms of volume, is mixed with $O_2$ gas.

In addition, since the first electrode may be cut to cause an open circuit when the first electrode is formed in the groove, an upper taper angle Θ should be etched at an angle of 90° or more.

As shown in FIG. 4B, a first electrode 260 connected to one electrode of the source and drain electrodes 245 exposed by the via hole 255 is formed. An edge 261 of the first electrode 260 is located in the groove 256.

When the first electrode 260 is an anode, the first electrode 260 may be a transparent electrode made of ITO or IZO having a high work function, or a reflection electrode made of any suitable material, for example, one material selected from a group consisting of Pt, Au, Ir, Cr, Mg, Ag, Ni, Al and an alloy thereof.

In addition, when the first electrode 260 is a cathode, the first electrode 260 may be a thin transparent electrode or a thick reflection electrode made of any suitable material, for example, one material selected from a group consisting of Mg, Ca, Al, Ag, Ba and an alloy thereof having a low work function.

Then, as shown in FIG. 4C, a pixel defining layer 270 used as a pixel isolation layer is deposited and patterned on substantially the entire surface of the substrate at which the first electrode 260 is formed, to form an opening P for exposing a predetermined portion of the pixel electrode.

The pixel defining layer 270 should be formed of any suitable material, for example, one material selected from a group consisting of acryl-based resin, benzocyclobuthene (BCB) and polyimid (PI).

Next, an organic layer 280 including at least an emission layer is formed in the opening P and on the first electrode 260 exposed in the opening P.

The organic layer 280 may further include at least one selected from a hole injection layer, a hole transport layer, a hole blocking layer, an electron transport layer, and an electron injection layer.

A second electrode 290 is formed on the organic layer 280.

When the second electrode 290 is a cathode, the second electrode 290 is formed on the organic layer 280 and formed of a thin transparent electrode or a thick reflection electrode made of any suitable material, for example, one conductive metal selected from a group consisting of Mg, Ca, Al, Ag, Ba and an alloy thereof having a work function lower than the first electrode.

In addition, when the second electrode 290 is an anode, the second electrode may be a transparent electrode made of ITO or IZO having a work function higher than the first electrode or a reflection electrode made of any suitable material, for example, one material selected from a group consisting of Pt, Au, Ir, Cr, Mg, Ag, Ni, Al and an alloy thereof.

As a result, the gap between the edge of the first electrode, at which an electric field may be readily concentrated, and the second electrode may be increased to reduce the electric field, thereby reducing or minimizing degradation of the organic material and increasing the lifetime of the OLED.

As can be seen from the foregoing, in accordance with the present invention, in the edge region of the unit pixel, the gap between the edge of the first electrode and the second electrode is increased to reduce the electric field between the first and second electrodes so that it is possible to reduce or minimize the degradation in the edge of the unit pixel, thereby increasing the lifetime of the OLED.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An organic light emitting display device (OLED) comprising:
   a substrate;
   a thin film transistor (TFT) located on the substrate, and having a semiconductor layer, a gate electrode, and source and drain electrodes on the substrate;
   a passivation layer located on the TFT and over substantially an entire surface of the substrate, and having a via hole for exposing one electrode of the source and drain electrodes, and a groove;
   a first electrode on the passivation layer, the first electrode being in electrical contact with the one electrode of the source and drain electrodes through the via hole, and having an edge located in the groove;
   a pixel defining layer located on the first electrode and having an opening for exposing a predetermined portion of the first electrode;
   an organic layer having at least one emission layer, a predetermined region of which is in contact with the predetermined portion of the first electrode; and
   a second electrode formed on the organic layer.

2. The device according to claim 1, wherein the passivation layer is made of one selected from a silicon oxide layer, a silicon nitride layer, and a stacked layer of the silicon oxide layer and the silicon nitride layer.

3. The device according to claim 1, wherein the passivation layer is formed to a thickness of approximately 0.1 μm~1 μm.

4. The device according to claim 1, wherein the groove is etched to a depth of approximately 0.05 μm~0.6 μm.

5. The device according to claim 1, further comprising a planarization layer on the passivation layer.

6. The device according to claim 5, wherein the planarization layer is formed of one material selected from a group consisting of polyimid resin, polyamide resin, polyacryl resin, polyphenol resin, silicon-based resin and benzocyclobuthene.

7. The device according to claim 5, wherein the planarization layer is formed to a thickness of approximately 0.5 μm~2 μm.

8. The device according to claim 1, wherein the first electrode comprises an anode or a cathode.

9. The device according to claim 1, wherein a distance between the edge of the first electrode and the source electrode is approximately 0.5 μm~4 μm.

10. The device according to claim 1, wherein the organic layer further includes at least one selected from a group consisting of a hole injection layer, a hole transport layer, a hole blocking layer, an electron transport layer, and an electron injection layer.

11. A method of fabricating an organic light emitting display device (OLED), comprising:
   forming a thin film transistor (TFT) having a semiconductor layer, a gate electrode, source and drain regions, and source and drain electrodes, on a substrate;
   forming a passivation layer over substantially an entire surface of the substrate having the TFT;
   forming a via hole for exposing one electrode of the source and drain electrodes and a groove formed by etching a portion of the passivation layer, on the passivation layer;
   forming a first electrode on the passivation layer, the first electrode being in electrical contact with one electrode of the source and drain electrodes through the via hole, and having an edge located in the groove;
   forming a pixel defining layer on substantially an entire surface of the substrate, the pixel defining layer having an opening for exposing a predetermined portion of the first electrode;
   forming an organic layer having at least an emission layer in the exposed opening of the pixel defining layer; and
   forming a second electrode on the organic layer.

12. The method according to claim 11, wherein the passivation layer is made of one selected from a silicon oxide layer, a silicon nitride layer, and a stacked layer of the silicon oxide layer and the silicon nitride layer.

13. The method according to claim 11, wherein the passivation layer is formed to a thickness of approximately 0.1 μm~1 μm.

14. The method according to claim 11, wherein the groove is etched to a depth of approximately 0.05 μm~0.6 μm.

15. The method according to claim 11, wherein the groove and the via hole are concurrently formed using a halftone mask process.

16. The method according to claim 11, wherein the groove is formed under a process pressure of approximately 5~300 mTorr using a mixed gas in which an $SF_6$ or $CF_4$ gas having an amount which is at least one percent (1%) of an amount of an $O_2$ gas in terms of volume, is mixed with the $O_2$ gas.

17. The method according to claim 11, wherein the OLED further includes a planarization layer on the passivation layer.

18. The method according to claim 17, wherein the planarization layer is formed of one material selected from a group consisting of polyimid resin, polyamide resin, polyacryl resin, polyphenol resin, silicon-based resin and benzocyclobuthene.

19. The method according to claim 17, wherein the planarization layer is formed to a thickness of approximately 0.5 μm~2 μm.

20. The method according to claim 17, wherein the groove is formed under a process pressure of approximately 5~300 mTorr by applying a plasma power of at least 500 W, and using a mixed gas in which one gas selected from $SF_6$, $CF_4$ and $CHF_3$ gases is mixed with an $O_2$ gas having an amount that is at least one percent (1%) of an amount of the selected gas in terms of volume.

21. The method according to claim 11, wherein the first electrode comprises an anode or a cathode.

22. The method according to claim 11, wherein a distance between the edge of the first electrode and the source electrode is approximately 0.05 μm~4 μm.

23. The method according to claim 11, wherein the organic layer further includes at least one selected from a group consisting of a hole injection layer, a hole transport layer, a hole blocking layer, an electron transport layer, and an electron injection layer.

* * * * *